(12) United States Patent  
Kim et al.

(10) Patent No.: US 12,291,029 B2
(45) Date of Patent: May 6, 2025

(54) APPARATUS AND METHOD FOR PROCESSING SUBSTRATE

(71) Applicant: SEMES CO., LTD., Chungcheongnam-do (KR)

(72) Inventors: Sung Ho Kim, Chungcheongnam-do (KR); Bo Yeon Hwang, Chungcheongnam-do (KR); Chang Jin Moon, Seoul (KR); Sol Min Park, Chungcheongnam-do (KR); Sang Seok Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 132 days.

(21) Appl. No.: 17/945,089

(22) Filed: Sep. 15, 2022

(65) Prior Publication Data

US 2023/0211601 A1    Jul. 6, 2023

(30) Foreign Application Priority Data

Dec. 30, 2021 (KR) ............ 10-2021-0193150
Feb. 3, 2022 (KR) ............ 10-2022-0014342

(51) Int. Cl.
*B41J 2/04* (2006.01)
*B41J 2/045* (2006.01)
*B41M 3/00* (2006.01)
*B41M 5/00* (2006.01)

(52) U.S. Cl.
CPC ....... *B41J 2/04556* (2013.01); *B41J 2/04581* (2013.01); *B41M 3/006* (2013.01); *B41M 5/0047* (2013.01); *B41M 5/007* (2013.01)

(58) Field of Classification Search
CPC .................................................. B41J 2/04556
See application file for complete search history.

(56) References Cited

U.S. PATENT DOCUMENTS

| 11,840,077 B2 | 12/2023 | Kiyokawa et al. |
| 2015/0099059 A1* | 4/2015 | Harjee ............... B41J 2/04593 427/8 |
| 2022/0081227 A1* | 3/2022 | Pun .................... B05C 13/02 |

FOREIGN PATENT DOCUMENTS

| JP | 10217444 | * 8/1998 |
| JP | 2003-232911 | 8/2003 |
| JP | 2005-88338 | 4/2005 |
| JP | 2007-15192 | 1/2007 |
| JP | 2009-208019 | 9/2009 |
| KR | 10-2015-0139705 | 12/2015 |
| KR | 10-2020-0029421 | 3/2020 |

(Continued)

OTHER PUBLICATIONS

Machine translation of document N.*

(Continued)

*Primary Examiner* — Austin Murata
(74) *Attorney, Agent, or Firm* — WOMBLE BOND DICKINSON (US) LLP

(57) ABSTRACT

The present disclosure provides a method for processing a substrate that can maintain a production amount even when a production model is changed. The method for processing a substrate comprises: disposing the substrate on a levitation stage; measuring a distance between the substrate and an inkjet head module; and changing a discharging speed of ink to be discharged from the inkjet head module based on the measured distance.

15 Claims, 12 Drawing Sheets

(56) References Cited

FOREIGN PATENT DOCUMENTS

KR  10-2021-0085106  7/2021
KR  10-2021-0143121  11/2021

OTHER PUBLICATIONS

Office Action dated Dec. 12, 2023 for Korean Patent Application No. 10-2022-0014342 and its English translation from Global Dossier.
Notice of Allowance dated Jun. 26, 2024 for Korean Patent Application No. 10-2022-0014342 and its English translation from Global Dossier.

* cited by examiner

| Head voltage | Discharging speed | Discharging volume |
|---|---|---|
| 8 | 0.6 | 0.8 |
| 9 | 0.8 | 0.9 |
| 10 | 1 | 1 |
| 11 | 1.2 | 1.1 |
| 12 | 1.4 | 1.2 |

APPARATUS AND METHOD FOR PROCESSING SUBSTRATE

CROSS-REFERENCE TO RELATED APPLICATION

This application claims priority from Korean Patent Applications No. 10-2021-0193150 filed on Dec. 30, 2021 and 10-2022-0014342 filed on Feb. 3, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to an apparatus and method for processing a substrate.

2. Description of the Related Art

A printing process (e.g., RGB patterning) is performed on a glass substrate to manufacture a display device such as an LCD panel or an LED panel. For example, the glass substrate may be disposed on a levitation stage, and ink may be discharged onto the glass substrate using an inkjet head module.

SUMMARY

Meanwhile, depending on the model produced, warpage characteristics of a glass substrate are different, and the amount of levitation varies accordingly. When the levitation amount of the glass substrate changes, a stand-off distance (i.e., the distance from a head to the glass substrate) is changed, which may lead to the occurrence of an adhesion error in the glass substrate. Therefore, whenever the production model was changed, an operator stopped an inkjet facility and adjusted the levitation amount of the glass substrate by the manual. It is very burdensome to change the levitation amount of the glass substrate by the manual, and a production amount decreases due to the stop of the inkjet facility.

Aspects of the present disclosure provide a method for processing a substrate that can maintain a production amount even when a production model is changed.

Aspects of the present disclosure also provide an apparatus for processing a substrate that can maintain a production amount even when a production model is changed.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided a method for processing a substrate, comprising: disposing the substrate on a levitation stage; measuring a distance between the substrate and an inkjet head module; and changing a discharging speed of ink to be discharged from the inkjet head module based on the measured distance.

According to another aspect of the present disclosure, there is provided a method for processing a substrate, comprising: disposing the substrate on a levitation stage; monitoring a levitation amount of the substrate; changing discharging speed information of ink to be discharged from an inkjet head module to the substrate according to the monitored levitation amount; changing the discharging amount information of the ink to be discharged from the inkjet head module to correspond to the changed discharging speed information; performing a mixing operation of selecting a plurality of nozzles to discharge the ink into each pixel area by reflecting the changed discharging amount information; and printing the ink on the substrate according to the mixing operation result.

According to an aspect of the present disclosure, there is provided an apparatus for processing a substrate, comprising: a first stage provided with a levitation stage; a second stage spaced apart from the first stage; a gantry disposed on the first stage and the second stage to cross the first stage and the second stage; an inkjet head module moving along the gantry and provided with a distance sensor configured to measure a distance from the substrate disposed on the levitation stage; and a controller configured to change a discharging speed of ink discharged from the inkjet head module based on the distance measured by the distance sensor.

Specific details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
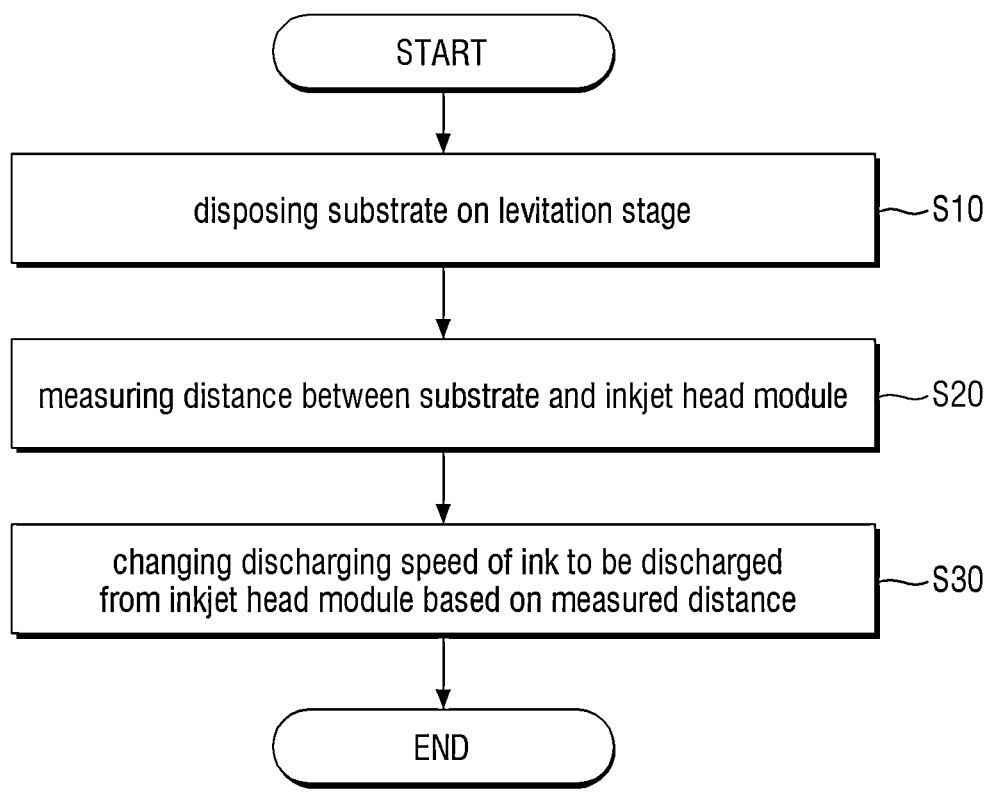
FIG. 1 is a flowchart describing a method for processing a substrate according to one embodiment of the present disclosure.

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The spatially relative terms "below," "beneath," "lower," "above," "upper" may be used to easily describe the correlation of a device or components with other devices or components. Spatially relative terms are to be understood as including terms in different directions of the device in use or operation in addition to the directions shown in the figures. For example, when flipping a device shown in the figure, a device described as "below" or "beneath" of another device may be placed "above" of another device. Thus, the exemplary term "below" can encompass both an orientation of above and below. The device can also be oriented in other directions, so that spatially relative terms can be interpreted according to orientation.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

Hereinafter, preferred embodiments according to the present disclosure are described in detail with reference to the accompanying drawings. The same or similar elements are assigned the same reference numerals irrespective of their reference numerals, and a redundant description thereof is omitted.

Figure 2:
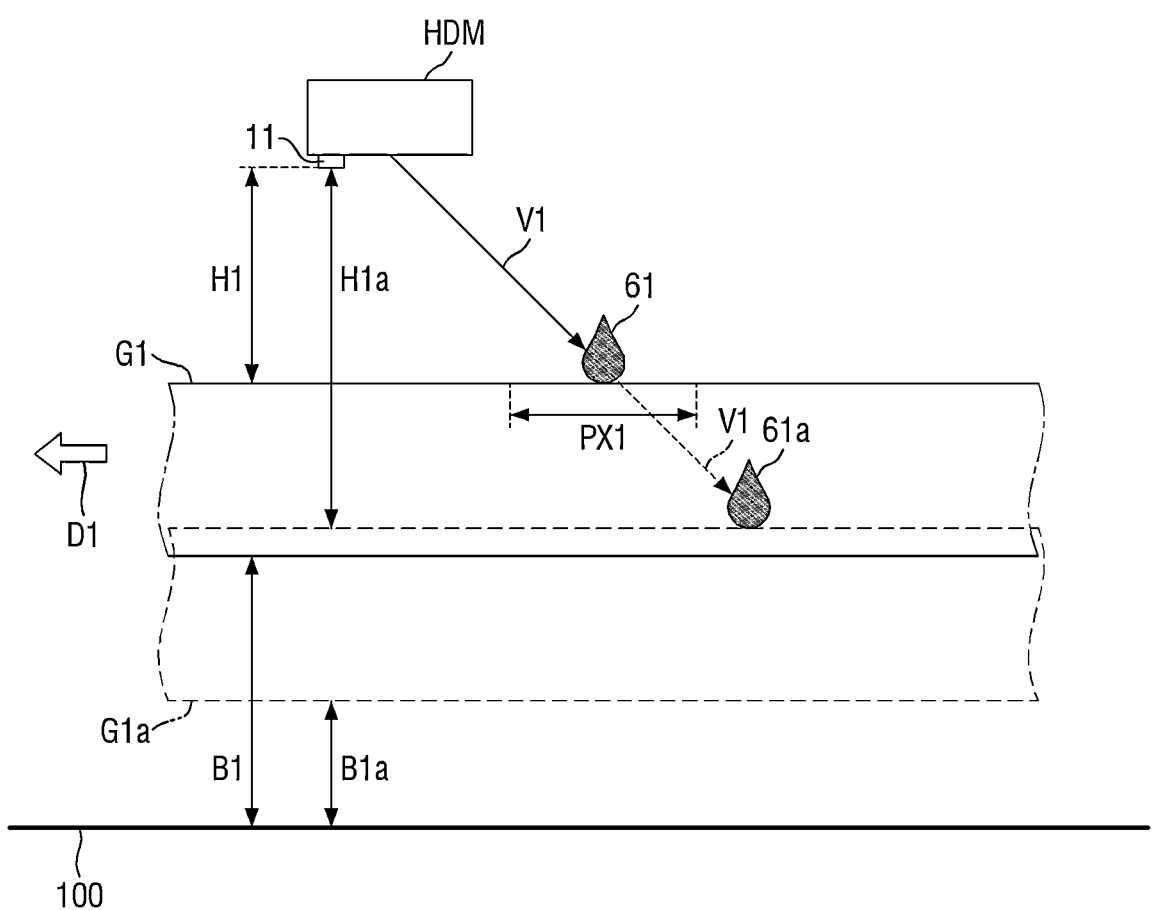
FIG. 2 is a diagram describing the effect of the method for processing a substrate of FIG. 1.

FIG. 1 is a flowchart describing a method for processing a substrate according to one embodiment of the present disclosure. FIG. 2 is a diagram describing the effect of the method for processing a substrate of FIG. 1

First, referring to FIGS. 1 and 2, a substrate G1 is disposed on a levitation stage 100 (S10).

Specifically, the substrate G1 may be a substrate for manufacturing a display device such as an LCD panel or an LED panel, and may be, for example, a glass substrate, but the present disclosure is not limited thereto.

The levitation stage 100 is a stage for moving the substrate G1. For example, the levitation stage 100 may include an air hole configured to inject compressed air to levitate the substrate G1, and/or a vacuum hole configured to accurately dispose the substrate by suctioning air.

An inkjet head module HDM configured to discharge ink onto the substrate G1 is disposed on the levitation stage 100. The inkjet head module HDM includes a plurality of heads, and each head includes a plurality of nozzles for discharging ink. In addition, the plurality of heads are installed in a head frame, and a distance sensor 11 is installed in the head frame. The distance sensor 11 may include, for example, a laser sensor, an ultrasonic sensor, and an infrared sensor, but the present disclosure is not limited thereto.

In addition, a distance H1 (i.e., a standoff distance) between the substrate G1 and the inkjet head module HDM is measured (S20).

For example, the distance H1 between the substrate G1 and the inkjet head module HDM may be measured using the distance sensor 11 installed in the inkjet head module HDM, but the present disclosure is not limited thereto.

Meanwhile, assuming that a distance between the substrate G1 and the levitation stage 100 remains constant, the distance H1 between the substrate G1 and the inkjet head module HDM is inversely proportional to a levitation amount B1 of the substrate G1. In other words, when the distance H1 between the substrate G1 and the inkjet head module HDM increases, the levitation amount B1 of the substrate G1 decreases, and when the distance H1 between the substrate G1 and the inkjet head module HDM decreases, the levitation amount B1 of the substrate G1 increases.

In addition, by measuring the distance H1 between the substrate G1 and the inkjet head module HDM, the levitation amount B1 of the substrate G1 may be calculated. For example, before disposing the substrate G1 on the levitation stage 100, a distance between the inkjet head module HDM and the levitation stage 100 is measured using the distance sensor 11. Then, after disposing the substrate G1 on the levitation stage 100, the distance between the inkjet head module HDM and the substrate G1 is measured using the distance sensor 11. The levitation amount B1 of the substrate G1 may be calculated by subtracting the distance H1 between the substrate G1 and the inkjet head module HDM and the thickness of the substrate G1 from the distance between the inkjet head module HDM and the levitation stage 100.

Then, a discharging speed of ink 61 to be discharged from the inkjet head module HDM is changed based on the measured distance H1 (S30).

Specifically, as the distance H1 increases, the discharging speed of the ink 61 needs to be increased, while, as the distance H1 decreases, the discharging speed of the ink 61 needs to be decreased. The reason for controlling the discharging speed of the ink 61 according to the distance H1 is as follows.

When the production model is changed, warpage characteristics of the substrates G1 and G1a also change, and the levitation amounts (see B1 and B1a of FIG. 2) are changed accordingly. The distances H1 and H1a between the substrates G1 and G1a and the inkjet head module HDM change according to the levitation amounts B1 and B1a of the substrates G1 and G1a. Accordingly, an adhesion error occurs in the substrates G1 and G1a.

As illustrated in FIG. 2, when the inkjet head module HDM discharges a first ink 61 at a first speed v1 while the substrate G1 moves in one direction D1, the first ink 61 may be settled in a first pixel area PX1.

On the other hand, the substrate G1a is in a lower position than the substrate G1. Herein, when the inkjet head module HDM discharges an ink 61a at the first speed v1, the ink 61a drops outside the first pixel area PX1. That is, the ink 61a may cause the adhesion error.

Since the substrate G1a is in a lower position than the substrate G1, the ink 61a is dropped longer than the first ink 61. In other words, when the first ink 61 drops for 0.2 seconds, the ink 61a may drop for 0.22 seconds. The distance at which the substrate G1a moves while the ink 61a drops for 0.22 seconds exceeds the distance at which the substrate G1 moves while the first ink 61 drops for 0.2 seconds. Accordingly, the first ink 61 discharged at the first speed v1 from the inkjet head module HDM is settled in the first pixel area PX1 of the substrate G1, while the ink 61a discharged at the first speed v1 from the inkjet head module HDM deviates from the first pixel area PX1 of the substrate G1a. Therefore, in order for the ink 61a discharged from the inkjet head module HDM to be settled in the first pixel area PX1 of the substrate G1a, the ink 61a has to be discharged at a speed faster than the first speed v1.

Figure 3:
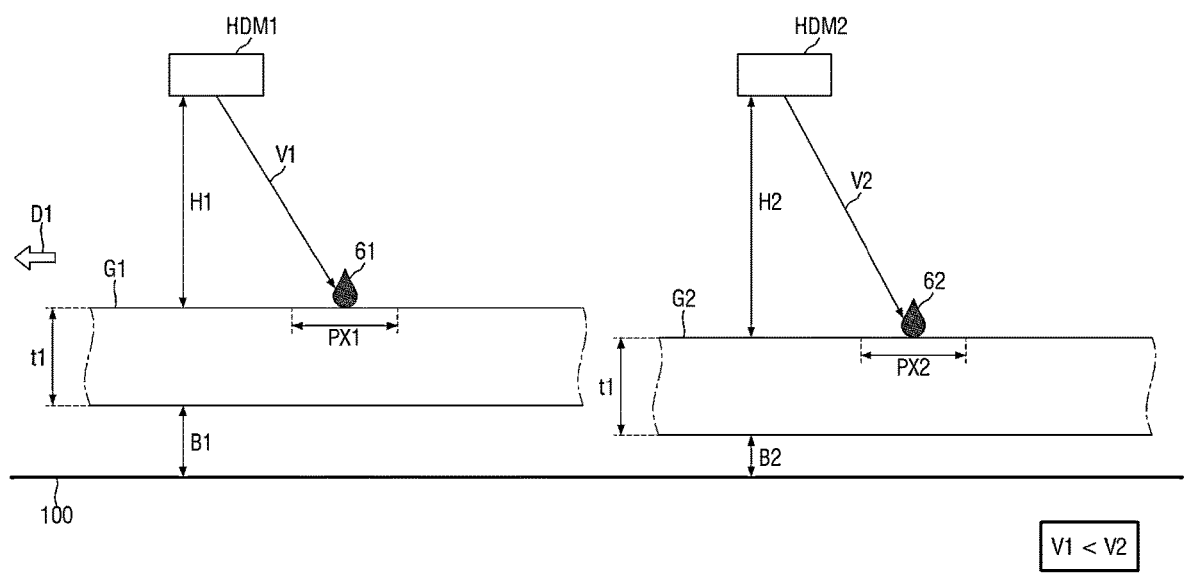
FIG. 3 is a diagram describing a first example of describing the method for processing a substrate of FIG. 1.
Figure 4:
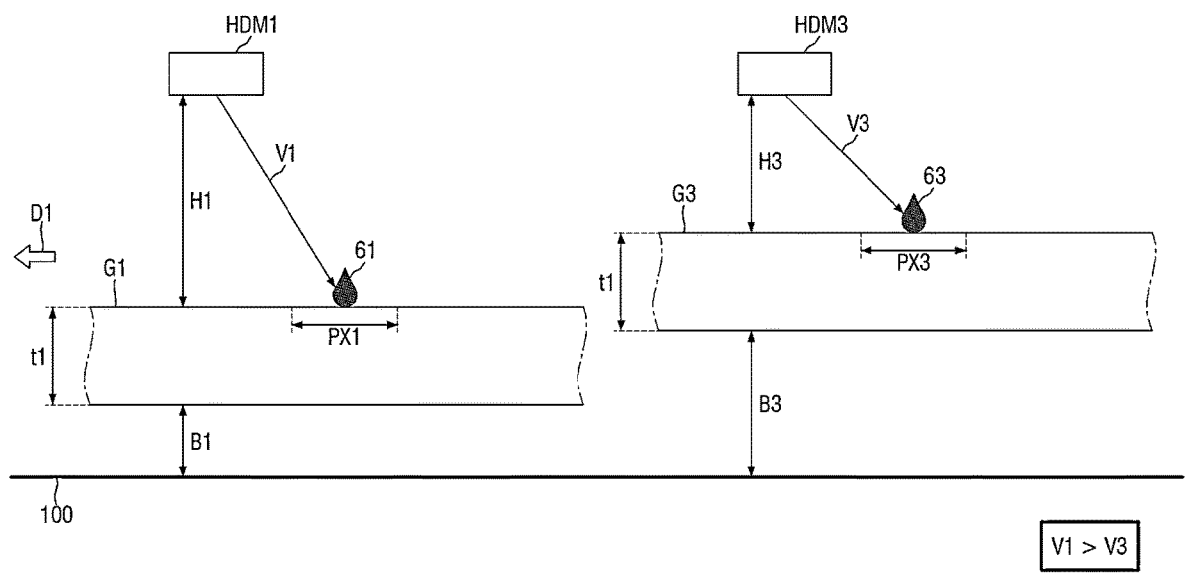
FIG. 4 is a diagram describing a second example of describing the method for processing a substrate of FIG. 1.
Figure 5:
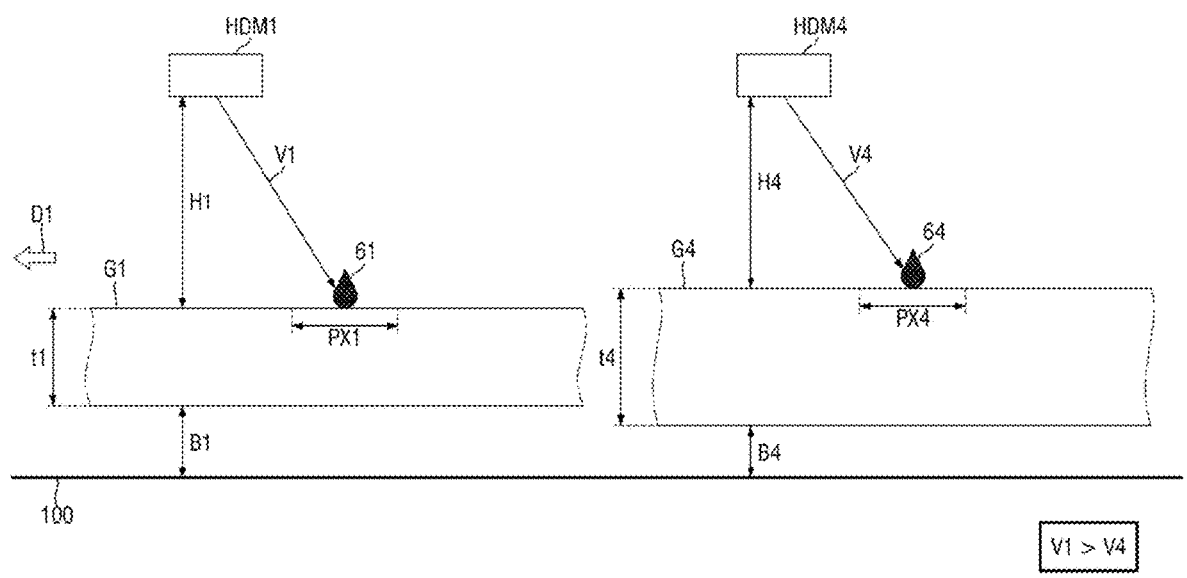
FIG. 5 is a diagram describing a third example of describing the method for processing a substrate of FIG. 1.
Figure 6:
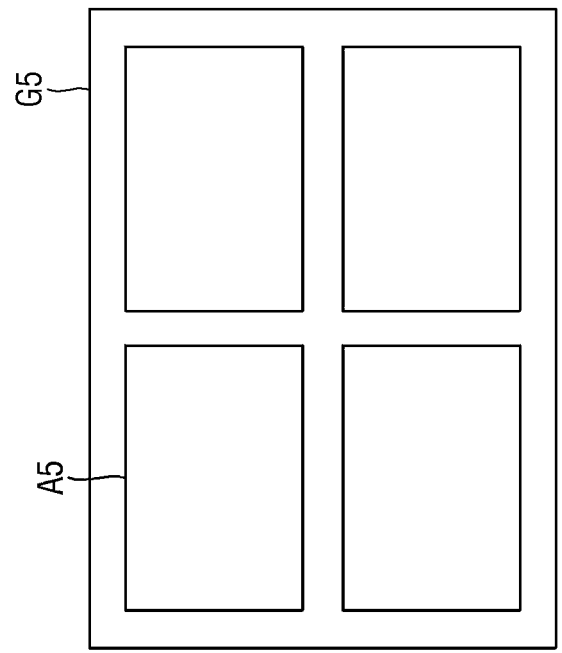
FIG. 6 is a diagram describing a fourth example of describing the method for processing a substrate of FIG. 1.
Figure 6:
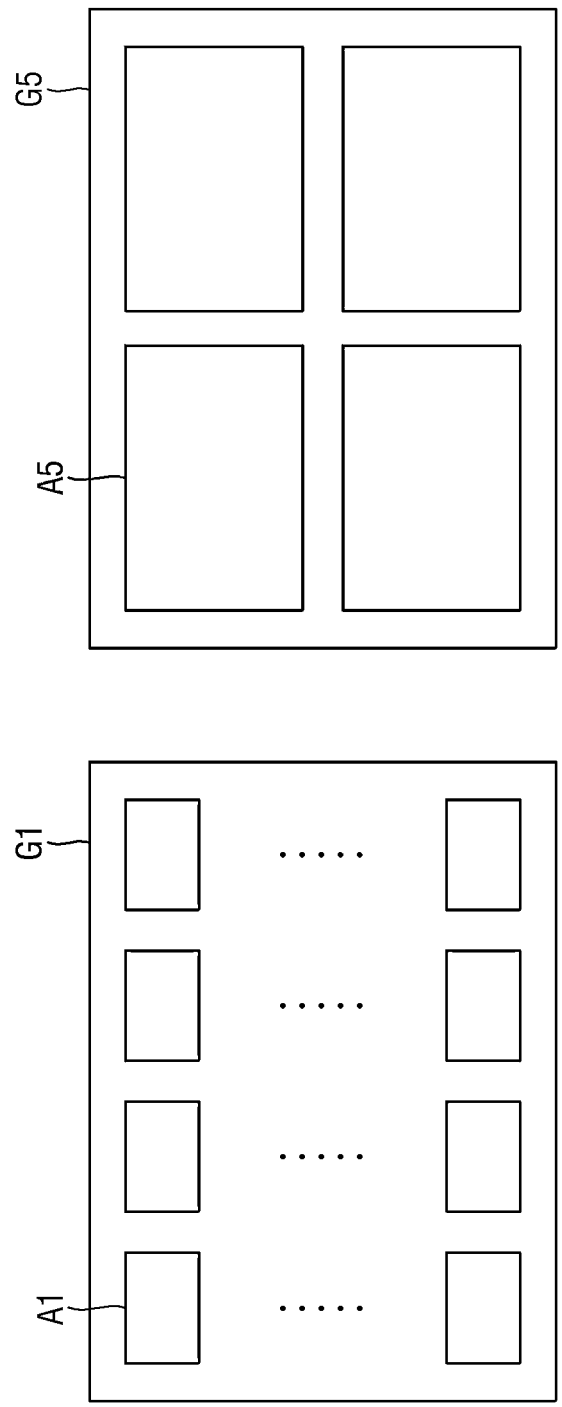

Hereinafter, an example of controlling the discharging speed will be described with reference to FIGS. 3 to 6. FIG. 3 is a diagram describing a first example of describing the method for processing a substrate of FIG. 1. FIG. 4 is a diagram describing a second example of describing the method for processing a substrate of FIG. 1. FIG. 5 is a diagram describing a third example of describing the method for processing a substrate of FIG. 1. FIG. 6 is a diagram describing a fourth example of describing the method for processing a substrate of FIG. 1.

First, referring to FIG. 3, the distance between the inkjet head module HDM1 and the substrate G1 is H1, and the levitation amount of the substrate G1 is B1. A distance between a inkjet head module HDM2 and a substrate G2 is H2, and the levitation amount of the substrate G2 is B2. The distance H2 between the inkjet head module HDM2 and the substrate G2 exceeds the distance H1 between the inkjet head module HDM1 and the substrate G1. The levitation amount B1 of the substrate G1 is larger than the levitation amount B2 of the substrate B2. It is assumed that the thicknesses of the substrates G1 and G2 are t1, which are identical to each other.

The first ink 61 discharged from the inkjet head module HDM1 at the first discharging speed v1 is settled in the first pixel area PX1.

The inkjet head module HDM2 discharges an ink 62 at a second discharging speed v2 faster than the first discharging speed v1. In this way, even if the distance H2 exceeds the distance H1, the ink 62 may be settled in a second pixel area PX2.

Then, referring to FIG. 4, a distance between an inkjet head module HDM3 and a substrate G3 is H3, and the levitation amount of the substrate G3 is B3. The distance H3 between the inkjet head module HDM3 and the substrate G3 is less than the distance H1 between the inkjet head module HDM1 and the substrate G1. The levitation amount B1 of the substrate G1 is smaller than the levitation amount B3 of the substrate B3. It is assumed that the thicknesses of the substrates G1 and G3 are t1, which are identical to each other.

The first ink 61 discharged from the inkjet head module HDM1 at the first discharging speed v1 is settled in the first pixel area PX1.

The inkjet head module HDM3 discharges an ink 63 at a third discharging speed v3 slower than the first discharging speed v1. In this way, even if the distance H3 is less than the distance H1, the ink 63 may be settled in a third pixel area PX3.

In addition, referring to FIG. 5, the thicknesses of the substrate G1 and a substrate G4 are different from each other. For example, the thickness of the substrate G1 is t1, while the thickness of the substrate G4 is t4.

A distance between an inkjet head module HDM4 and the substrate G4 is H4, and the levitation amount of the substrate G4 is B4. The distance H4 between the inkjet head module HDM4 and the substrate G4 is less than the distance H1 between the inkjet head module HDM1 and the substrate G1. Due to the thickness t4 of the substrate G4, the levitation amount B4 of the substrate G4 may be smaller than the levitation amount B1 of the substrate B1.

The first ink 61 discharged from the inkjet head module HDM1 at the first discharging speed v1 is settled in the first pixel area PX1.

The inkjet head module HDM4 discharges an ink 64 at a fourth discharging speed v4 slower than the first discharging speed v1. In this way, even if the distance H4 is less than the distance H1, the ink 62 may be settled in a fourth pixel area PX4.

The configuration illustrated in FIG. 5 is exemplary. For example, even if the thickness t4 of the substrate G4 is thicker than the thickness t1 of the substrate G1, when the weight of the substrate G4 is relatively lighter than the weight of the substrate G1, the levitation amount B4 of the substrate G4 may be larger than the levitation amount B1 of the substrate G1.

Referring to FIG. 6, the substrate G1 may be a mother glass for generating a plurality of first applications A1, while a substrate G5 may be a mother glass for generating a plurality of second applications A5. As illustrated, the size of the first application A1 may be smaller than the size of the second application A5. For example, the first application A1 may have a 34-inch display, and the second application A5 may have a 67-inch display. After all predetermined material layers are formed on the substrates G1 and G5, they are cut for each of the applications A1 and A5.

Even if the substrates G1 and G5 have the same size, when the produced applications A1 and A5 are different, the amount of levitation of the substrates G1 and G5 in the levitation stage may change. This is so because the density and type of material layers formed vary according to the applications A1 and A5. In general, when an application (e.g., A1) is small, the pixel size becomes relatively small and density increases. Accordingly, the substrate G1 may be heavier than the substrate G5. As a result, the levitation amount of the substrate G1 on the levitation stage 100 may be smaller than that of the substrate G5.

Accordingly, when the first application A1 is smaller than the second application A5, the discharging speed of ink discharged to the substrate G1 is a first speed, and the discharging speed of ink discharged to the substrate G5 is a fifth speed, the first speed is faster than the fifth speed.

Figures 7, 8:
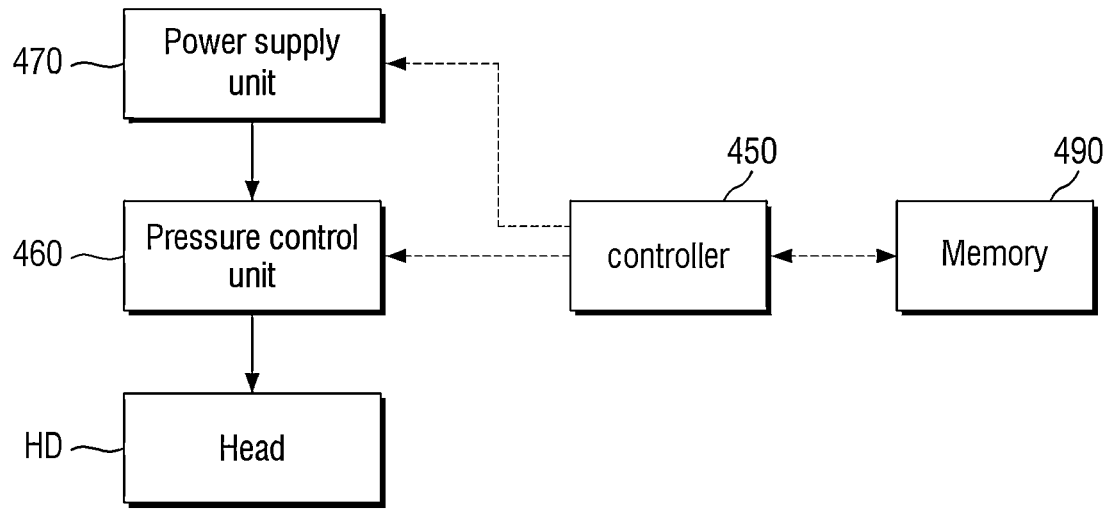
FIG. 7 is a block diagram describing a configuration related to a head of the inkjet head module.
FIG. 8 is an exemplary table of describing a relationship between a head voltage, a discharging speed and a discharging amount.

In addition, referring to FIG. 7, a method of controlling the discharging speed of ink will be described. FIG. 7 is a block diagram describing a configuration related to a head of the inkjet head module. FIG. 8 is an exemplary table of describing a relationship between a head voltage, a discharging speed and a discharging amount.

First, referring to FIG. 7, a plurality of heads HD are installed in the inkjet head module HDM, and each of the plurality of heads HD is connected to the corresponding pressure control unit 460. In addition, the pressure control unit 460 is connected to a corresponding power supply unit 470. A controller 450 controls the pressure control unit 460 and the power supply unit 470 and uses information (i.e., head voltage information, discharging speed information, discharging amount information, etc.) stored in a memory 490.

Specifically, the head HD discharges ink via a nozzle. The pressure control unit 460 includes a piezoelectric element, and the piezoelectric element is a member that presses the nozzle. The power supply unit 470 supplies a head voltage with a predetermined waveform to the piezoelectric element.

The head HD may be provided to be connected to a reservoir (not shown) configured to receive and store ink from the outside. Furthermore, the head HD may be provided with a plurality of nozzles installed. In other words, 128 or 256 nozzles may be provided in one head HD, but the present disclosure is not limited thereto. The nozzles may be arranged in a line at predetermined intervals and may be provided to discharge droplets in an amount in pico liter (pl) units. The nozzle discharges ink by a pressure change.

The piezoelectric element is provided to press the nozzle so that the pressure of the nozzle changes. The power supply unit 470 is provided to supply the head voltage with a predetermined waveform to the piezoelectric element so that the piezoelectric element may press the nozzle.

The controller 450 controls the piezoelectric element of the pressure control unit 460 and the power supply unit 470. When the controller 450 allows the power supply unit 470 to supply a relatively high head voltage to the pressure control unit 460, the pressure control unit 460 controls the head HD with relatively high pressure. As a result, the head HD discharges ink at a high speed. On the other hand, when the controller 450 allows the power supply unit 470 to supply a relatively low head voltage to the pressure control unit 460, the pressure control unit 460 controls the head HD with relatively low pressure. As a result, the head HD discharges ink at a slow speed.

In addition, when the plurality of nozzles are provided, the piezoelectric device and the power supply unit 470 may be provided to correspond, in the one-to-one way, to each of the nozzles. In other words, a number of piezoelectric elements and power supply units 470 corresponding to each of the nozzles in the head HD may be provided. Accordingly, the droplets may be discharged via each of the nozzles by the piezoelectric elements and the power supply units 470. When 128 nozzles are provided in one head HD1, 128 piezoelectric devices and 128 power supply units 470 may be provided; likewise, when 256 nozzles are provided, 256 piezoelectric devices and 256 power supply units 470 may be provided. Accordingly, the amount of ink discharged from the nozzle may be independently controlled by controlling power applied to the piezoelectric element via the power supply unit 470.

Herein, referring to FIG. 8, the magnitude of the head voltage, an ink discharging speed in the head HD, and an ink discharging amount are associated with to each other. For example, with an increase of the magnitude of the head voltage, the ink discharging speed from the head HD increases, and the amount of ink discharged from the head HD may also increase. As illustrated in a table 499 of FIG. 8, assuming that when the head voltage is 10, the ink discharging speed is 1, and the ink discharging amount is 1, when the head voltage drops to 9, the ink discharging speed may amount to 0.8, while the ink discharging amount may be 0.9. On the other hand, when the head voltage increases to 11, the ink discharging speed may be 1.2, and the ink discharging amount may be 1.1. The figures illustrated in FIG. 8 are only exemplary.

Referring to FIGS. 7 and 8, the table 499 is stored in the memory 490, and the controller 450 may control the head voltage using the table 499 stored in the memory 490.

For example, when an initial setting distance between the substrate G1 and the inkjet head module HDM is 10, the head voltage may be set to 10. In that case, the ink discharging speed is 1.

When the distance between the substrate G1 and the inkjet head module HDM is determined to increase by measuring the distance between the substrate G1 and the inkjet head module HDM, the controller 450 calculates how much the ink discharging speed needs to be increased. For example, the controller 450 may determine that the ink discharging speed needs to increase to 1.2. The controller 450 may find out that the head voltage corresponding to the ink discharging speed of 1.2 is to 11 by referring to the table 499. Accordingly, the controller 450 increases the head voltage from 10 to 11.

When the distance between the substrate G1 and the inkjet head module HDM is determined to decrease by measuring the distance between the substrate G1 and the inkjet head module HDM, the controller 450 calculates how much the ink discharging speed needs to be decreased. For example, the controller 450 may determine that the ink discharging speed needs to decrease to 0.6. The controller 450 may find out that the head voltage corresponding to the ink discharging speed of 0.6 is 8 by referring to the table 499. Accordingly, the controller 450 decreases the head voltage from 10 to 8.

Figure 9:
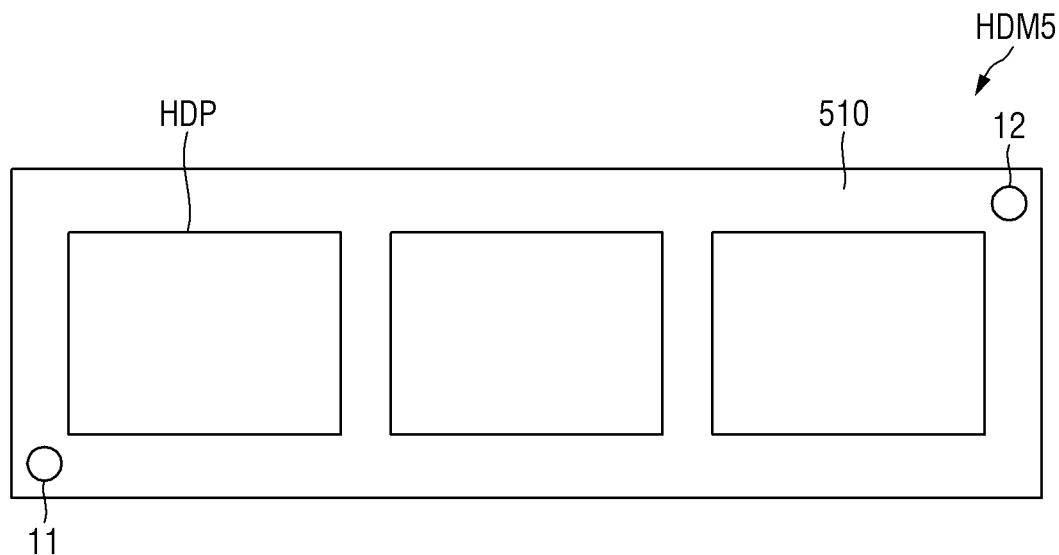
FIG. 9 is a diagram illustrating an example of the inkjet head module installed in an apparatus for processing a substrate according to some embodiments of the present disclosure.
Figure 10:
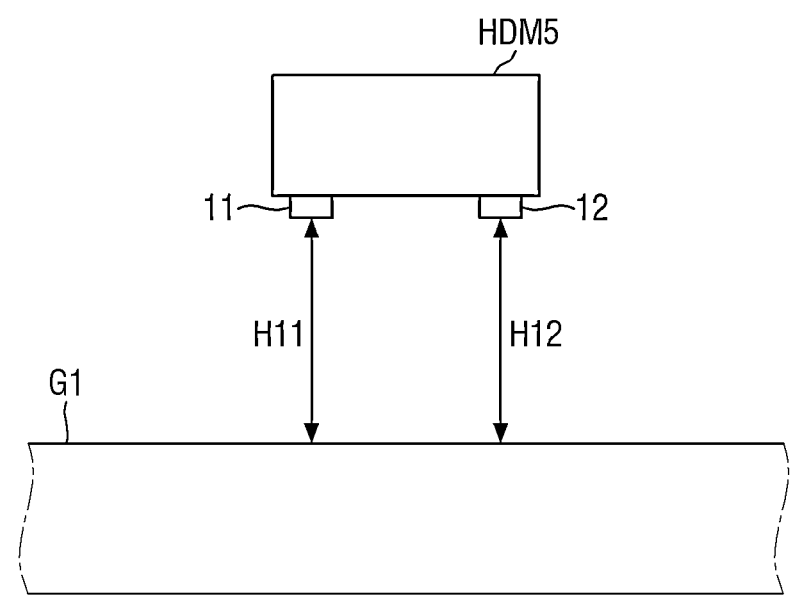
FIG. 10 is a diagram describing a method for calculating a distance between the substrate and the inkjet head module.

FIG. 9 is a diagram illustrating an example of the inkjet head module installed in an apparatus for processing a substrate according to some embodiments of the present disclosure. FIG. 10 is a diagram describing a method for calculating a distance between the substrate and the inkjet head module.

First, referring to FIG. 9, an inkjet head module HDM5 includes a head frame 510, a plurality of head packs HDP installed in the head frame 510, and at least one distance sensor 11 or 12 installed in the head frame 510. The head pack HDP includes a plurality of heads HD. The distance sensors 11 and 12 may include, for example, a laser sensor, an ultrasonic sensor, an infrared sensor, and so forth, but the present disclosure is not limited thereto.

As illustrated in FIG. 9, when the head frame 510 has a rectangular shape, the distance sensors 11 and 12 may be disposed in a diagonal direction of the head frame 510.

Herein, referring to FIG. 10, the distances H11 and H12 are measured using each of the plurality of distance sensors 11 and 12. In other words, the distance H11 between the distance sensor 11 and the substrate G1 is measured using the distance sensor 11, and the distance H12 between the distance sensor 12 and the substrate G1 is measured using the distance sensor 12. An average of the measured distances H11 and H12 is regarded as a distance between the substrate G1 and the inkjet head module HDM5. Herein, the average may be a simple average or a weighted average.

Figure 11:
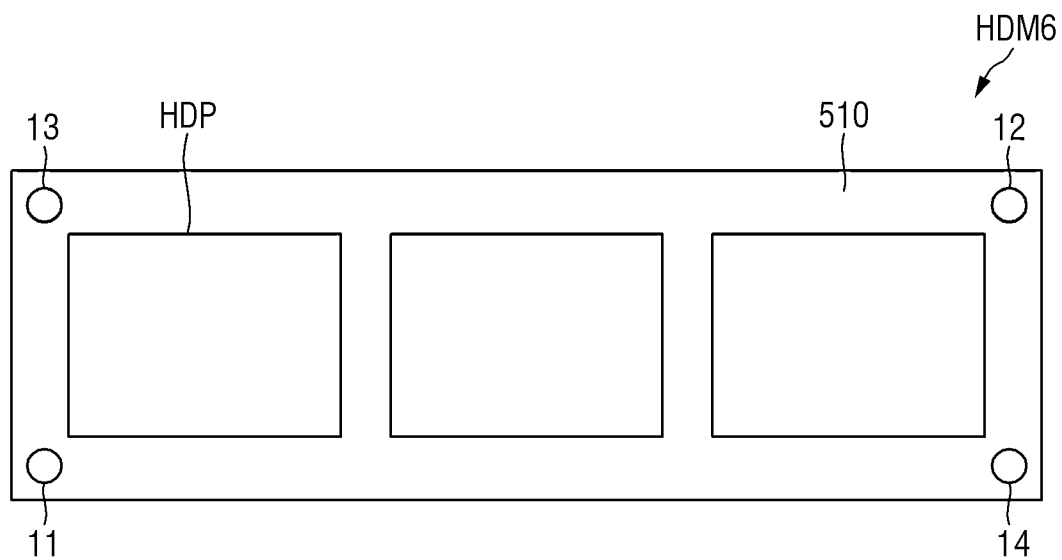
FIG. 11 is a diagram describing another example of the inkjet head module installed in the apparatus for processing a substrate according to some embodiments of the present disclosure.

FIG. 11 is a diagram describing another example of the inkjet head module installed in the apparatus for processing a substrate according to some embodiments of the present disclosure.

Referring to FIG. 11, when the head frame 510 has a rectangular shape, distance sensors 11, 12, 13 and 14 may be disposed at corners of the head frame 510. The distance to the substrate G1 is measured using each of the plurality of distance sensors 11, 12, 13, and 14, and an average of the measured distances is regarded as the distance between the substrate G1 and the inkjet head module HDM6.

Figure 12:
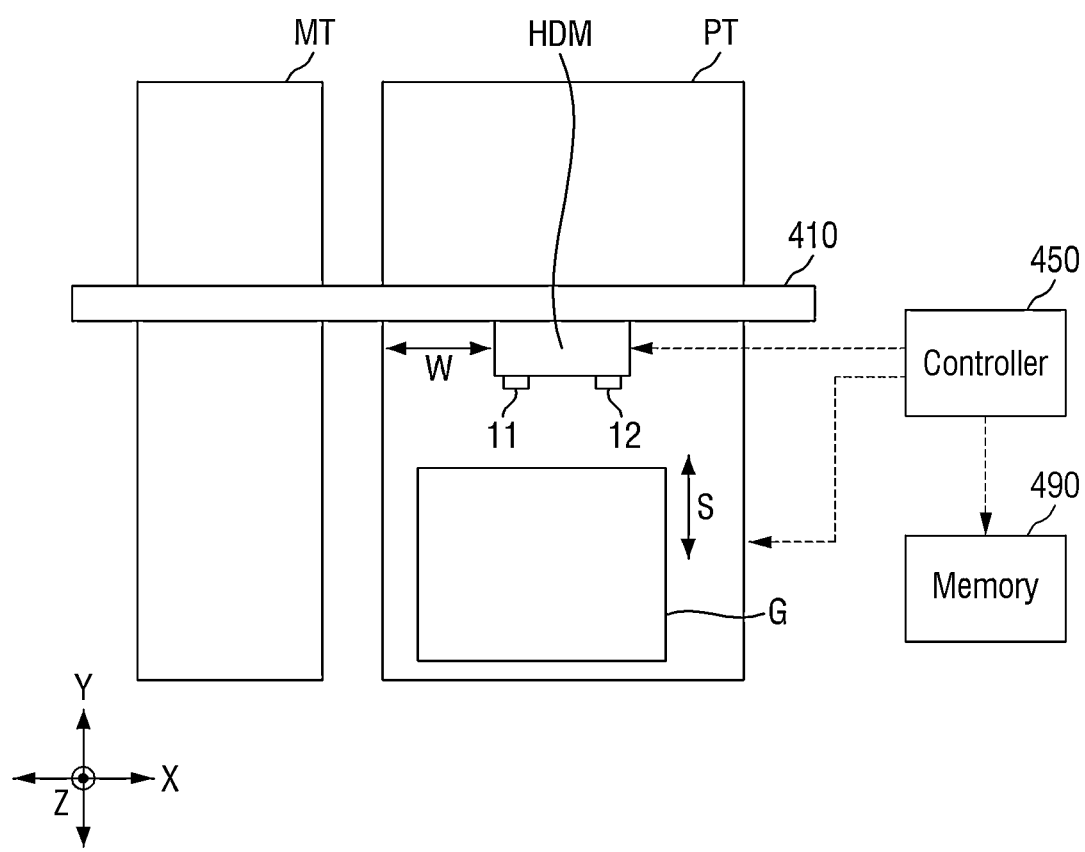
FIG. 12 is a diagram describing the apparatus for processing a substrate according to some embodiments of the present disclosure.
Figure 13:
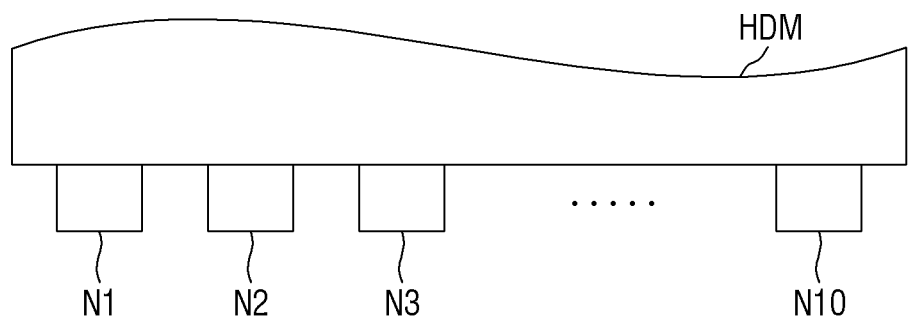
FIG. 13 is a diagram describing a mixing operation.
Figure 13:
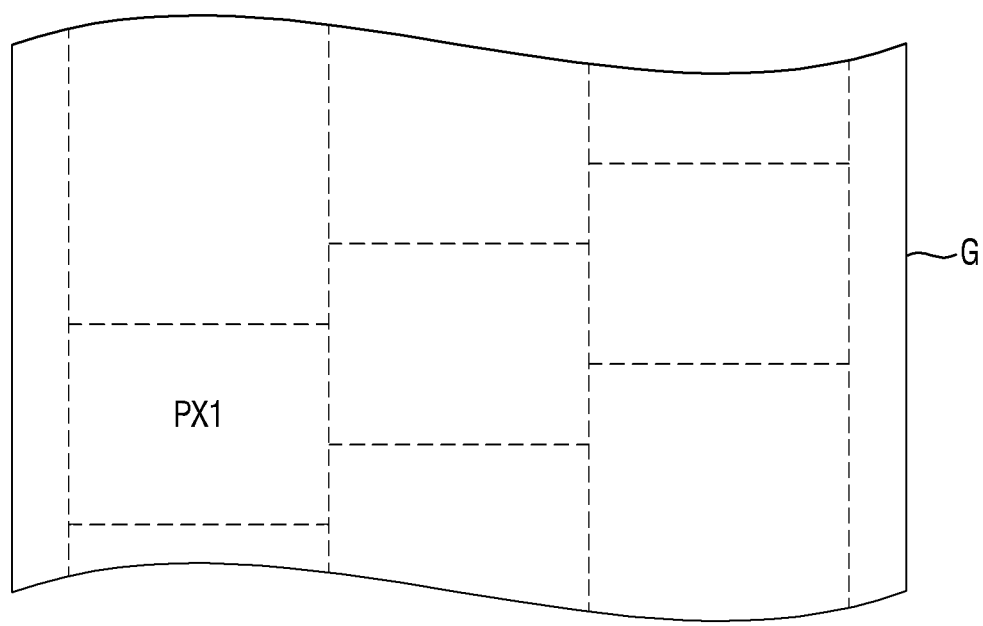
Figure 13:
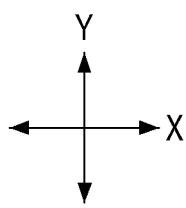

FIG. 12 is a diagram describing the apparatus for processing a substrate according to some embodiments of the present disclosure. FIG. 13 is a diagram describing a mixing operation.

First, referring to FIG. 12, the apparatus for processing a substrate according to some embodiments of the present disclosure includes a first stage PT, a second stage MT, a gantry 410, the inkjet head module HDM, the distance sensors 11 and 12, the controller 450, and the memory 490.

The first stage PT is an area for supporting and moving the substrate G. The levitation stage is installed in the first stage PT. A substrate G may move along a second direction Y. The substrate G may include, for example, a glass substrate.

The second stage MT may be disposed adjacent to the first stage PT in a first direction X. At least one test substrate may be disposed on the second stage MT. The test substrate may be disposed to extend long along the second direction Y. Each of the test substrates has a flexible property, and may be provided in, for example, a roll-to-roll scheme.

The gantry 410 is disposed on the first stage PT and the second stage MT to cross the first stage PT and the second stage MT. The gantry 410 may extend long in the first direction X.

The inkjet head module HDM is installed in the gantry 410 and may move along the gantry 410 (see reference mark W). As illustrated, the inkjet head module HDM may move in the first direction X, but the present disclosure is not limited thereto. The inkjet head module HDM may include a plurality of heads configured to discharge ink, and each of the heads may include a plurality of nozzles. The ink may be, for example, a quantum dot (QD) ink, but the present disclosure is not limited thereto.

During a normal operation, the inkjet head module HDM discharges the ink to the substrate G disposed on the levitation stage of the first stage PT, in an upper part of the first stage PT. The normal operation is meant to discharge the ink (or chemical liquid) onto a substrate in the process of producing a display device. For example, while the substrate G performs a swathing operation S along the second direction Y, the inkjet head module HDM discharges the ink while moving in the first direction X.

In addition, the inkjet head module HDM discharges the ink to the test substrate disposed in the second stage MT, in an upper part of the second stage MT during a test operation. The test operation is meant to check an operation of the inkjet head module HDM. Through the test operation, it is possible to check, for example, whether the ink discharged from the inkjet head module HDM drops to a predetermined position, as well as evaluate the volume and density of the ink discharged from the inkjet head module HDM.

The controller 450 controls the first stage PT, the second stage MT, the inkjet head module HDM, and the distance sensors 11 and 12.

Specifically, when the substrate G is inserted onto the levitation stage of the first stage PT, the distance sensors 11 and 12 measure distances to the substrate G. The controller 450 determines a distance between the substrate G and the inkjet head module HDM based on the distances to the substrate G. Based on the determined distance, the discharging speed of the ink to be discharged from the inkjet head module HDM is determined. The memory 490 stores a table including the head voltage, and the discharging speed and the discharging amount corresponding to the head voltage (see FIG. 8). The controller 450 determines the head voltage and the discharging amount based on the determined discharging speed.

The head voltage information and the discharging amount information determined as described above are updated in the memory 490. The controller 450 performs the mixing operation of selecting the plurality of nozzles to discharge the ink in each pixel area (e.g., PX1) by reflecting the updated discharging amount information. Herein, the mixing operation will be described in detail with reference to FIG. 13.

The plurality of nozzles (e.g., N1 to N10) are installed in the inkjet head module HDM. A plurality of pixel areas (e.g., PX1) are disposed on the substrate G. It is assumed that the pixel is completed only when the ink of a volume 3 is discharged to each pixel area (e.g., PX1) of the substrate G.

In order to match the volume 3 to the pixel area PX1, the controller 450 may select, for example, a nozzle N1 having the discharging amount of 0.9, a nozzle N2 having the discharging amount of 1, and a nozzle N3 having a discharging amount of 1.1. Since the three selected nozzles N1, N2 and N3 discharge the ink to the pixel area PX1 once, the volume 3 can be matched (i.e., 0.9+1.1+1=3). Alternatively, the controller 450 may select, for example, the nozzle N2 having the discharging amount of 1, a nozzle N9 having the discharging amount of 0.8, and a nozzle N10 having the discharging amount of 1.2 (i.e., 1+0.8+1.2=3).

In order to match a target volume to each pixel area PX1, selecting the nozzles N1 to N10 to be used is referred to as a mixing operation.

Figure 14:
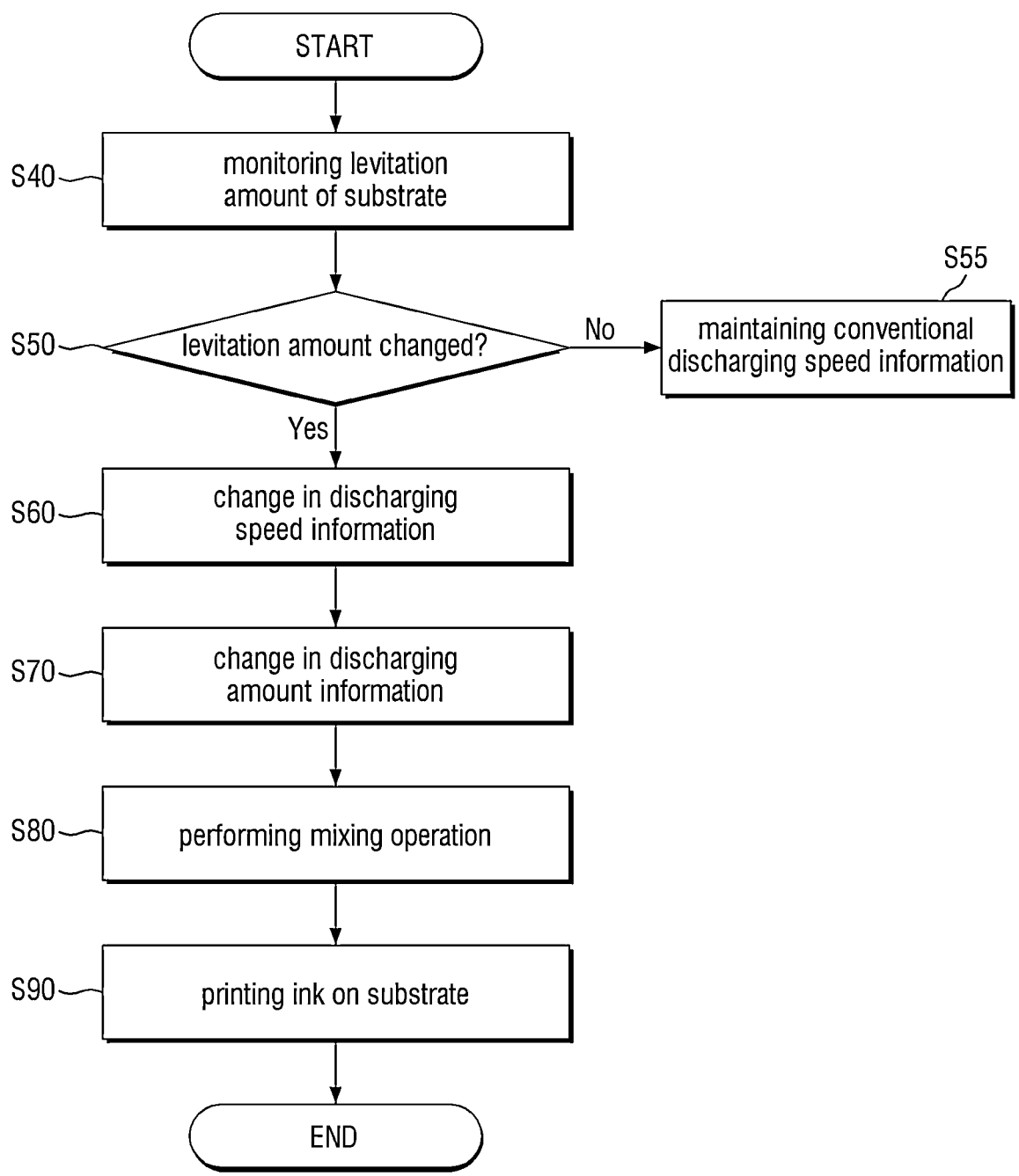
FIG. 14 is a flowchart describing the method for processing a substrate according to another embodiment of the present disclosure.

FIG. 14 is a flowchart describing the method for processing a substrate according to another embodiment of the present disclosure.

Referring to FIGS. 12 to 14, the substrate G is disposed on the levitation stage of the first stage PT. Then, the levitation amount of the substrate G is monitored (S40).

Specifically, the distance H1 between the inkjet head module HDM and the substrate G is determined using the distance sensors 11 and 12 installed in the inkjet head module HDM.

The levitation amount B1 of the substrate G is measured using the determined distance H1. For example, before disposing the substrate G on the levitation stage, a distance between the inkjet head module HDM and the levitation stage is measured using the distance sensors 11 and 12. Then, after disposing the substrate G on the levitation stage 100, the distance between the inkjet head module HDM and the substrate G is measured using the distance sensors 11 and 12. The levitation amount B1 of the substrate G can be calculated by subtracting the distance H1 between the substrate G and the inkjet head module HDM and the thickness of the substrate G from the distance between the substrate G and the levitation stage.

Then, it is monitored whether the levitation amount B1 of the substrate G is changed (S50).

If there is no change in the levitation amount of the substrate G (no), the discharging speed information and the discharging amount information of the conventional ink do not change (S55).

If there is a change in the levitation amount of the substrate G (yes), the discharging speed information of the ink to be discharged from the inkjet head module HDM to the substrate G changes according to the monitored levitation amount (S60).

Specifically, when the levitation amount B1 is larger than the existing levitation amount, as the distance between the substrate G and the inkjet head module HDM decreases, the discharge speed of the ink is reduced. When the levitation amount B1 is smaller than the existing levitation amount, as the distance between the substrate G and the inkjet head module HDM increases, the discharge speed of the ink is enhanced. The head voltage corresponding to the discharging speed of the ink is determined. The changed discharging speed information of the ink is updated.

Then, the information on the discharging amount of the ink to be discharged from the inkjet head module HDM is changed to correspond to the changed discharging speed information (S70).

As described above, the table including the head voltage, and the discharging speed and the discharging amount corresponding to the head voltage, is stored in the memory 490. The controller 450 finds the discharging amount corresponding to the head voltage and the discharging speed using the table 499, and updates the discharging amount information of the ink.

Then, the mixing operation of selecting the plurality of nozzles to discharge the ink to each pixel area is performed by reflecting the changed discharge amount information (S80).

Then, the ink is printed on the substrate according to the mixing operation result (S90).

Then, the printing operation for the substrate G is terminated, the substrate G moves out of the first stage PT, and a new substrate is inserted into the first stage PT. The levitation amount is measured again for the new substrate, and the discharging speed information and/or the discharging amount information of the ink is updated according to the levitation amount measured again. According to the updated information, the mixing operation is performed so as to perform a printing operation.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

What is claimed is:

1. A method for processing a substrate, comprising:
   levitating the substrate on a levitation stage at a levitation amount;
   measuring, using one or more sensors of an inkjet head module disposed on the levitation stage, a distance between the substrate and the inkjet head module;
   controlling the inkjet head module to discharge ink onto the substrate at an ink discharging speed based on the measured distance to automatically adjust for the levitation amount of the substrate; and
   further controlling the inkjet head module to actively adjust a volume of the ink being discharged by the inkjet head module to discharge the ink onto the substrate at an ink discharge amount that corresponds to the ink discharging speed.

2. The method of claim 1, wherein controlling the inkjet head module to discharge the ink at the ink discharge amount comprises performing, by the inkjet head module, a determination using a table including one or more head voltages, each of the one or more head voltages being associated with one or more of the ink discharging speed and the ink discharge amount.

3. The method of claim 1, further comprising: controlling the inkjet head module to perform a mixing operation of selecting one or more nozzles on the inkjet head module to discharge the ink into each pixel area on the substrate based on the ink discharge amount.

4. The method of claim 1, wherein a head of the inkjet head module is connected to a piezoelectric element that operates based on a head voltage, and the controlling the inkjet head module to discharge the ink at the ink discharging speed comprises changing a magnitude of the head voltage.

5. The method of claim 1, wherein the inkjet head module includes a head frame, a plurality of heads installed in the head frame, and at least one distance sensor installed in the head frame as one of the one or more sensors, and a distance between the substrate and the inkjet head module is measured using the at least one distance sensor.

6. The method of claim 5, wherein the one or more sensors comprise a plurality of distance sensors and an average of a plurality of distances measured by each of the plurality of distance sensors is used as the distance between the substrate and the inkjet head module.

7. The method of claim 1, wherein when the measured distance is a first distance, the ink discharging speed of the inkjet head module is changed to a first speed, and when the measured distance is a second distance larger than the first distance, the ink discharging speed of the inkjet head module is changed to a second speed faster than the first speed.

8. The method of claim 1, wherein when the substrate is a mother glass for generating a plurality of first applications, the ink discharging speed of the inkjet head module is a third speed, and when the substrate is a mother glass for generating a plurality of second applications, the ink discharging speed of the inkjet head module is a fourth speed, wherein a size of the first application is smaller than a size of the second application, and the third speed is faster than the fourth speed.

9. The method of claim 1, wherein when a thickness of the substrate is a first thickness, the ink discharging speed of the inkjet head module is a fifth speed, and when a thickness of the substrate is a second thickness, the ink discharging speed of the inkjet head module is a sixth speed different from the fifth speed.

10. The method of claim 1, further comprising:
    after discharging the ink on the substrate on the levitation stage, ejecting the substrate out of the levitation stage;
    levitating a second substrate on the levitation stage;
    measuring, using the one or more sensors, a second distance between the second substrate and the inkjet head module, the second distance being different from the measured distance; and
    controlling the inkjet head module to discharge the ink at a second ink discharge speed associated with the second distance.

11. A method for processing a substrate, comprising:
    levitating the substrate on a levitation stage;
    monitoring, using one or more sensors, a levitation amount of the substrate;
    controlling an inkjet head module to discharge ink at an ink discharging speed based on the monitored levitation amount;
    controlling the inkjet head module to actively adjust a volume of the ink being discharged by the inkjet head module to discharge the ink at an ink discharging amount based on the ink discharging speed;
    controlling the inkjet head module to perform a mixing operation of selecting one or more nozzles on the inkjet head module to discharge the ink into each pixel area on the substrate based on the ink discharging amount; and
    printing the ink on the substrate using the inkjet head module by controlling the inkjet head module to discharge the ink through the one or more nozzles according to a result of the mixing operation to automatically adjust for the levitation amount of the substrate.

12. The method of claim 11, wherein controlling the inkjet head module to discharge the ink at the ink discharging speed and the ink discharging amount comprises performing, by the inkjet head module, a determination using a table including one or more head voltages, each of the one or more head voltages being associated with one or more of the ink discharging speed and the ink discharging amount.

13. The method of claim 11, wherein a head of the inkjet head module is connected to a piezoelectric element that operates based on a head voltage, and the controlling the inkjet head module to discharge the ink at the ink discharging speed comprises changing a magnitude of the head voltage.

14. The method of claim 11, wherein the inkjet head module includes a head frame, a plurality of heads installed in the head frame, and a plurality of distance sensors installed in the head frame as the one or more sensors, the distance between the substrate and the inkjet head module being measured using the plurality of distance sensors where an average of a plurality of distances measured by each of the plurality of distance sensors is used as the distance between the substrate and the inkjet head module.

15. The method of claim 11, further comprising:
  before disposing the substrate on the levitation stage, measuring a first distance between the inkjet head module and the levitation stage using a distance sensor installed in the inkjet head module, the distance sensor being one of the one or more sensors,
  wherein the monitoring of the levitation amount of the substrate comprises:
    after disposing the substrate on the levitation stage, measuring a second distance between the inkjet head module and the substrate using the distance sensor; and
    calculating the levitation amount of the substrate by subtracting the second distance and a thickness of the substrate from the first distance.

* * * * *